United States Patent
Su et al.

(10) Patent No.: US 8,581,419 B2
(45) Date of Patent: Nov. 12, 2013

(54) MULTI-CHIP STACK STRUCTURE

(75) Inventors: Keng-Li Su, Hsinchu (TW); Hsin-Chi Lai, Taichung (TW); Chih-Sheng Lin, Tainan County (TW); Zhe-Hui Lin, Changhua County (TW)

(73) Assignee: Industrial Technology Research Institute, Hsinchu (TW)

( * ) Notice: Subject to any disclaimer, the term of this patent is extended or adjusted under 35 U.S.C. 154(b) by 279 days.

(21) Appl. No.: 12/968,285

(22) Filed: Dec. 15, 2010

(65) Prior Publication Data
US 2012/0139092 A1 Jun. 7, 2012

(30) Foreign Application Priority Data
Dec. 6, 2010 (TW) ................................ 99142393 A (51) Int. Cl.
H01L 23/48 (2006.01)
(52) U.S. Cl.
USPC .................... 257/777; 257/659; 257/E23.011; 257/E23.114
(58) Field of Classification Search
USPC ................... 257/659, 777, E23.114, E23.011
See application file for complete search history.

(56) References Cited

U.S. PATENT DOCUMENTS

| | | | |
|---|---|---|---|
| 6,294,838 B1 | | 9/2001 | Peng |
| 6,403,041 B1 * | | 6/2002 | Takahashi et al. ............. 422/240 |
| 6,720,662 B1 * | | 4/2004 | Den .............. 257/777 |
| 6,857,470 B2 | | 2/2005 | Park et al. |
| 7,317,256 B2 * | | 1/2008 | Williams et al. ............. 257/777 |
| 7,432,592 B2 | | 10/2008 | Shi et al. |
| 7,495,317 B2 * | | 2/2009 | Song et al. ................... 257/659 |
| 7,738,249 B2 | | 6/2010 | Chan et al. |
| 2004/0159954 A1* | 8/2004 | Hetzel et al. ................... 257/777 |
| 2005/0201031 A1* | 9/2005 | Furuta ........................... 361/91.1 |
| 2008/0258259 A1* | 10/2008 | Osaka et al. .................. 257/532 |
| 2008/0272464 A1* | 11/2008 | Do et al. ........................ 257/620 |
| 2010/0237477 A1* | 9/2010 | Pagaila et al. ................. 257/660 |
| 2010/0295189 A1* | 11/2010 | Chou et al. .................... 257/777 |
| 2011/0095403 A1* | 4/2011 | Lee et al. ....................... 257/660 |
| 2011/0215361 A1* | 9/2011 | Wang .............................. 257/99 |
| 2012/0012990 A1* | 1/2012 | Pagaila et al. ................. 257/659 |
| 2012/0098104 A1* | 4/2012 | Jin ................................. 257/620 |
| 2012/0193815 A1* | 8/2012 | Chou et al. .................... 257/774 |

OTHER PUBLICATIONS

E.Diaz-Alvarez et al., "Package and chip-level EMI/EMC structure design, modeling and simulation", Electronic Components and Technology Conference, issued on Jun. 1, 1999, p. 873-p. 878.
W.Woods et al., "Radiative coupling in BGA packaging for mixed-signal and high-speed digital", Electronic Components and Technology Conference, issued on May 29, 2001, p. 511-p. 517.
Deepak Sekar et al., "A 3D-IC Technology with Integrated Microchannel Cooling", Interconnect Technology Conference, 2008. IITC 2008. International, issued on Jun. 1, 2008, p. 13-p. 15.
Brock J. Lameres et al., "Novel 3-D Coaxial Interconnect System for Use in System-in-Package Applications", IEEE Transactions on Advanced Packaging, issued on Feb. 2010, p. 37-p. 47.
Young-Joon Lee et al.,"Co-Optimization and Analysis of Signal, Power, and Thermal Interconnects in 3D Stacked ICs", IEEE Transactions on Computer-Aided Design of Integrated Circuits and Systems, issued on Jan. 1, 2010, p. 1-p. 16.

* cited by examiner

*Primary Examiner* — Daniel Luke
*Assistant Examiner* — Joseph C Nicely
(74) *Attorney, Agent, or Firm* — Jianq Chyun IP Office (57) ABSTRACT

A multi-chip stack structure including a first chip, a second chip, a shielding layer, and a plurality of conductive bumps is provided. The second chip is stacked on the first chip. The second chip has a plurality of through silicon via (TSV) structures to conduct a reference voltage. The shielding layer and the plurality of conductive bumps are disposed between the first chip and the second chip, and are electrically connected to the plurality of TSV structures. The shielding layer can isolate noises and improve signal coupling between two adjacent chips.

7 Claims, 13 Drawing Sheets

MULTI-CHIP STACK STRUCTURE

CROSS-REFERENCE TO RELATED APPLICATION

This application claims the priority benefit of Taiwan application serial no. 99142393, filed on Dec. 6, 2010. The entirety the above-mentioned patent application is hereby incorporated by reference herein and made a part of specification.

TECHNICAL FIELD

The disclosure relates to an Integrated Circuit (IC), in particular, to a stack structure of a three-dimensional (3D) IC.

BACKGROUND

With the decreasing of size and cost of electronic products, miniaturization of IC chips and 3D stack packaging have become a major direction for the development of the semiconductor technology in the future. Therefore, major semiconductor manufacturers around the world invest a lot of manpower to develop a through silicon via (TSV) process technology of the 3D IC, in the hope of packaging various digital logics, memories, and analog chip circuits into a single package, so as to significantly improve operating speed and functions of the IC. The main objective of the 3D IC is to thin a chip to be stacked, meanwhile use a TSV structure to run through a silicon wafer, and use a micro bump to transmit a circuit signal to a chip of a next layer. The increasing number of stacked layers results in more powerful functions of the IC.

Figure 1:
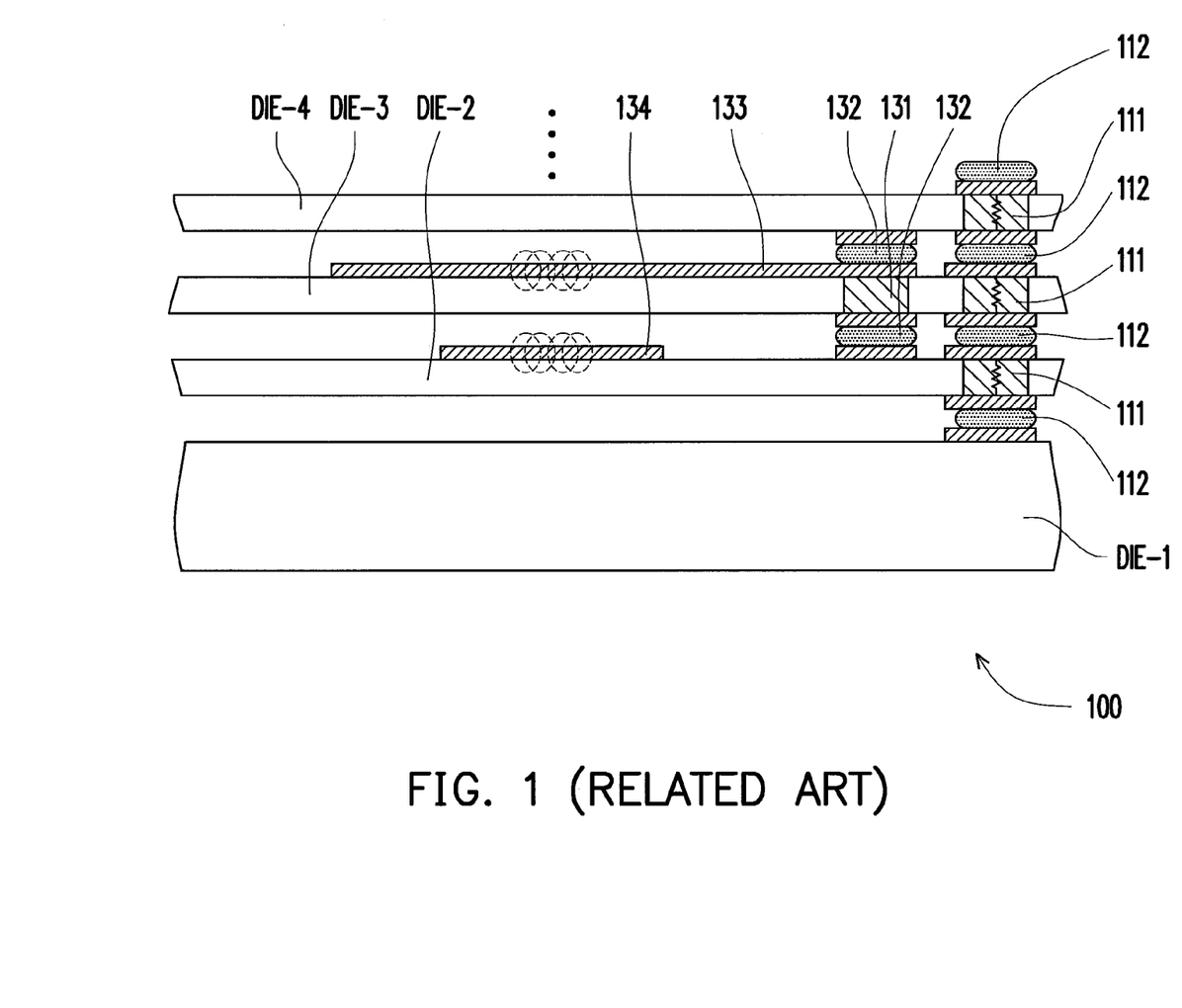
FIG. 1 is a schematic sectional view illustrating a conventional multi-chip stack structure.

With the chip becoming thinner and with the number of the stacked layers becoming bigger, some problems of bad circuit characteristics emerge. For example, FIG. 1 is a schematic sectional view illustrating a conventional multi-chip stack structure 100. The multi-chip stack structure 100 includes a plurality of mutually stacked chips, such as a chip DIE-1, a chip DIE-2, a chip DIE-3, and a chip DIE-4. An interconnecting line 133 represents an interconnecting line transmitting a data signal on the chip DIE-3, and an interconnecting line 134 represents an interconnecting line transmitting a data signal on the chip DIE-2.

The chips DIE-1 to DIE-4 are mutually stacked, as shown in FIG. 1. Under-fill is filled between two adjacent chips. With TSV structures and micro bumps, various signals, such as a power supply voltage VDD and a ground voltage GND, can be transmitted between various chips. For example, TSV structures 111 and micro bumps 112 are responsible for transmitting the power supply voltage VDD needed by the chips DIE-1 to DIE-4. A TSV structure 131 and a micro bump 132 are responsible for transmitting a data signal between the chip DIE-2 and the chip DIE-3.

FIG. 1 does not illustrate a layout structure of active areas inside the chips DIE-1 to DIE-4. The TSV structures 111 and the micro bumps 112 are responsible for transmitting the power supply voltage VDD needed by the active areas inside the chips DIE-1 to DIE-4. FIG. 1 does not illustrate any interconnecting line between the TSV structure 111 and the active area. Since the TSV structure 111 has a certain internal resistance (as shown in FIG. 1), a voltage level error may occur between the power supply voltages VDD of the layers of the chips.

Furthermore, with the chips becoming thinner, a problem of noise interference generated between signal lines of different chips and signal coupling becomes much more serious. For example, a data signal of the interconnecting line 134 of the chip DIE-2 and a data signal of the interconnecting line 133 of the chip DIE-3 interfere with each other due to a close distance.

However, in the future, high degree of circuit integration and downsizing are the trend of the development of the 3D IC chip stack technology. Thinner wafers and the increased number of stacked layers make the integration of transistor components, circuits, and signals more complex, and even digital circuits, analog circuits, high-frequency circuits, and power circuits are also integrated into the 3D IC chip, which makes the seriousness of the problem of electromagnetic, static, electrostatic, and noise interference coupling more obvious. In addition, with the increasing number of the stacked layers, a circuit density increases, thus resulting in a more serious problem of heat dissipation.

SUMMARY

A multi-chip stack structure is introduced herein, which includes a first chip, a second chip, a plurality of conductive bumps, and a shielding layer. The second chip is stacked on the first chip. The second chip has a plurality of TSV structures to conduct a reference voltage. The plurality of conductive bumps is disposed between the first chip and the second chip, and is electrically connected to the plurality of TSV structures. The shielding layer is disposed between the first chip and the plurality of conductive bumps, and is electrically connected to the plurality of conductive bumps.

A multi-chip stack structure is introduced herein, which includes a first chip, a second chip, a plurality of second conductive bumps, and a second shielding layer. The second chip is stacked on the first chip. The second chip has a plurality of second TSV structures to conduct a second reference voltage. The plurality of second conductive bumps is disposed between the first chip and the second chip, and is electrically connected to the plurality of second TSV structures. The second shielding layer is disposed between the second chip and the plurality of second conductive bumps, and is electrically connected to the plurality of second TSV structures.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 2:
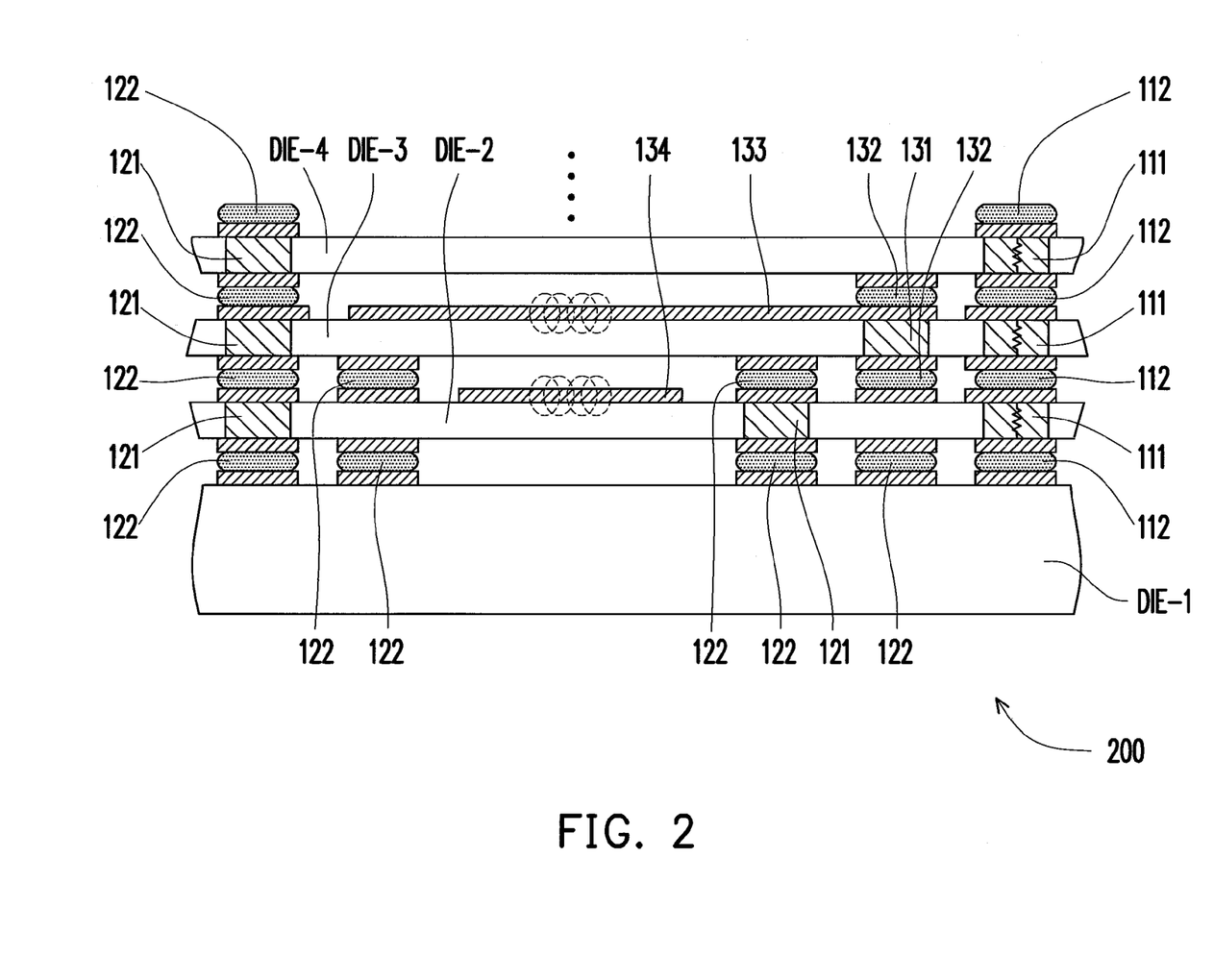
FIG. 2 is a schematic sectional view of a multi-chip stack structure according to an exemplary embodiment.

FIG. 2 is a schematic sectional view of a multi-chip stack structure 200 according to an exemplary embodiment. The multi-chip stack structure 200 includes a plurality of mutually stacked chips, such as a chip DIE-1, a chip DIE-2, a chip DIE-3, and a chip DIE-4. An interconnecting line 133 represents an interconnecting line transmitting a data signal on the chip DIE-3, and an interconnecting line 134 represents an interconnecting line transmitting a data signal on the chip DIE-2. The chips from DIE-1 to DIE-4 are mutually stacked, as shown in FIG. 1. Under-fill is filled between two adjacent chips.

With TSV structures and micro bumps, various signals, such as a power supply voltage VDD and a ground voltage GND, can be transmitted between various chips. For example, TSV structures 111 and micro bumps 112 are responsible for transmitting the power supply voltage VDD needed by the chips DIE-1 to DIE-4. A TSV structure 131 and micro bumps 132 are responsible for transmitting a data signal between the chip DIE-2, the chip DIE-3, and the chip DIE-4.

FIG. 2 does not illustrate a layout structure of active areas inside the chips DIE-1 to DIE-4. The TSV structures 111 and the micro bumps 112 are responsible for transmitting the power supply voltage VDD needed by the active areas inside the chips DIE-1 to DIE-4. FIG. 2 does not illustrate any interconnecting line between the TSV structure 111 and the active area.

In order to take into account of stress between the plurality of mutually stacked chips, symmetry and uniformity of the layout of the chips, or in order to improve a process yield, in this exemplary embodiment, dummy areas (areas not used to dispose signal transmission lines yet) in the multi-chip stack structure 200 are disposed with a plurality of dummy TSV structures 121 and a plurality of dummy micro bumps 122. The dummy TSV structures 121 and the dummy micro bumps 122 are not used to transmit signals (such as a data signal and a control signal).

In the following exemplary embodiments, an effective protective barrier is formed by using dummy space, the dummy TSV structures, and the dummy micro bumps of the stacked chips, so that not only the problem of noise interference and signal coupling is solved, but also change of temperature of circuits inside the stack structure is uniformed. In addition, the plurality of dummy micro bumps and the plurality of dummy TSV structures are used together to transmit the same reference voltage (such as a power supply voltage VDD or a ground voltage GND), so as to reduce an error of a reference voltage level between the different chips.

Figure 3:
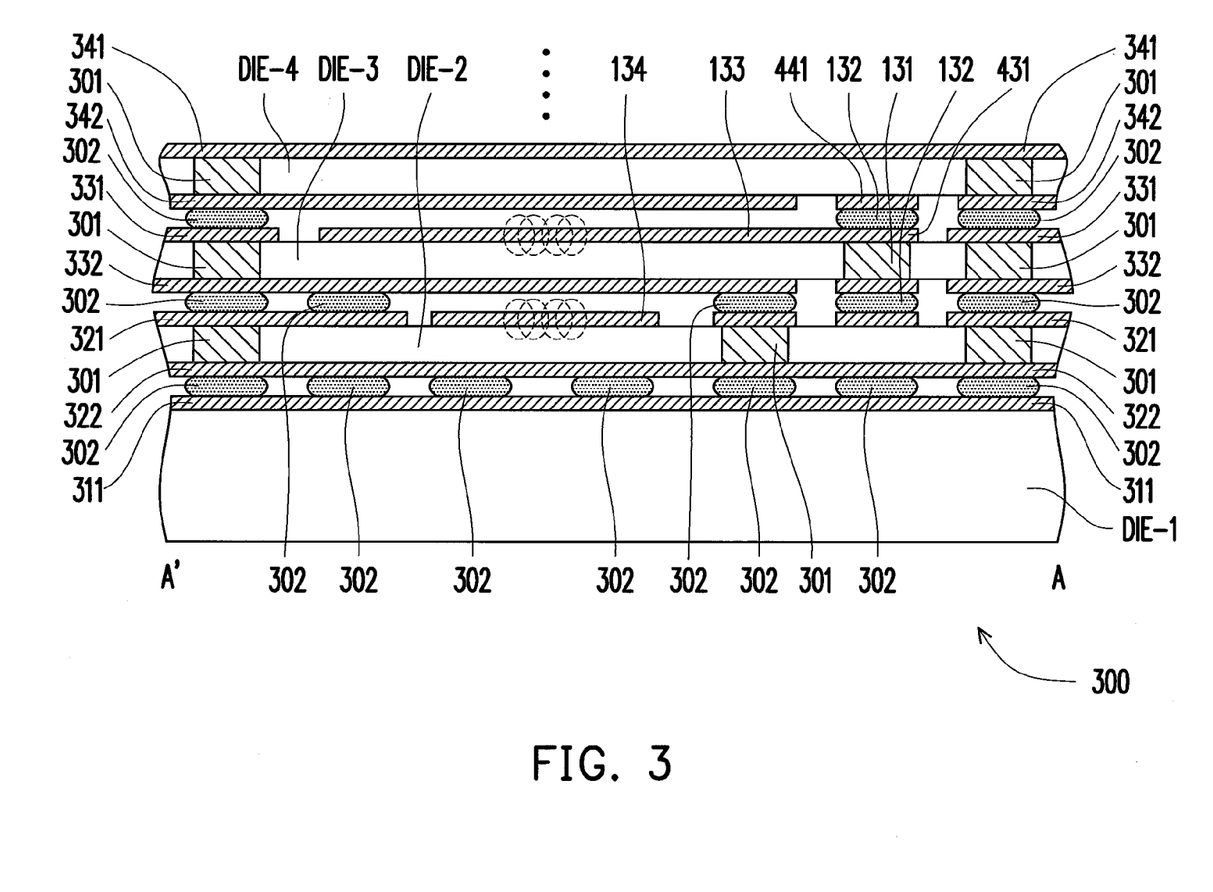
FIG. 3 is a schematic sectional view along a section line A-A' illustrating a multi-chip stack structure according to another exemplary embodiment of the present disclosure.

FIG. 3 is a schematic sectional view along a section line A-A' illustrating a multi-chip stack structure 300 according to another exemplary embodiment of the present disclosure. Each of chips DIE-1 to DIE-4 has at least one first TSV structure 301. Through the first TSV structures 301 and first conductive bumps 302, a first reference voltage can be conducted to the chips DIE-1 to DIE-4. The above first conductive bumps 302 may be of any conductive material, for example, micro bumps. In this exemplary embodiment, dummy TSV structures (for example, the dummy TSV structures 121 shown in FIG. 2) and dummy micro bumps (for example, the dummy micro bumps 122 shown in FIG. 2) between the stacked chips are used to realize the first TSV structures 301 and the first conductive bumps 302. The first reference voltage may be a power supply voltage VDD, a ground voltage GND, or other power supply voltages of fixed levels (other than signals).

Details of implementation of the multi-chip stack structure 300 are shown in relevant descriptions of the multi-chip stack structure 200 shown in FIG. 2. Different from the multi-chip stack structure 200, in the multi-chip stack structure 300, each dummy area of a lower surface and an upper surface of each of the chips is disposed with a shielding layer of a conductive material (such as metal), and the shielding layer is electrically connected to the first conductive bump 302. For example, a dummy area of the upper surface of the chip DIE-1 is disposed with a first shielding layer 311; dummy areas of an upper surface and a lower surface of the chip DIE-2 are respectively disposed with a first shielding layer 321 and a second shielding layer 322; dummy areas of an upper surface and a lower surface of the chip DIE-3 are respectively disposed with a first shielding layer 331 and a second shielding layer 332; and dummy areas of an upper surface and a lower surface of the chip DIE-4 are respectively disposed with a first shielding layer 341 and a second shielding layer 342. The above upper surface may be a top metal layer or a front re-distribution layer (RDL) of the chip, and the above lower surface may be a bottom metal layer or a bottom RDL of the chip.

All of the shielding layers 311, 321, 322, 331, 332, 341, and 342 are electrically connected to the plurality of the first conductive bumps 302 respectively through the plurality of first TSV structures 301. Therefore, the shielding layers 311, 321, 322, 331, 332, 341, and 342 can be electrically connected to the first reference voltage (for example, the power supply voltage VDD or the ground voltage GND). Through an electric field shielding effect of the shielding layers 311, 321, 322, 331, 332, 341, and 342, the problem of electromagnetic wave and noise interference generated between signal lines of the different chips and signal coupling can be solved. For example, the problem of the interference between the interconnecting line 134 of the second chip DIE-2 and the interconnecting line 133 of the third chip DIE-3 is solved by isolation performed by the second shielding layer 332.

A material with good heat transfer performance may be selected as the material of the shielding layers 311, 321, 322, 331, 332, 341, and 342. Since large shielding layers are disposed in the dummy areas of the chips DIE-1 to DIE-4, the shielding layers may be used as heat sink layers between the chips to conduct heat inside the stack structure. Dissipation of heat generated by the chips DIE-1 to DIE-4 may be accelerated by the conducting of the shielding layers 311, 321, 322, 331, 332, 341, and 342, thus uniforming change of temperature of circuits inside the multi-chip stack structure 300, decreasing operating temperature inside the chip stack structure, and ensuring steady operation of the circuits.

Additionally, in this exemplary embodiment, the plurality of first TSV structure 301 and the plurality of first conductive bump 302 are disposed to together conduct the first reference voltage to the chips DIE-1 to DIE-4. The plurality of first TSV structures 301 and the plurality of first conductive bumps 302 together transmit the same reference voltage, that is, transmission paths of the reference voltage connected in parallel are increased, so that equivalent resistance of the transmission paths of the reference voltage may be decreased, thus reducing an error of a reference voltage level between the different chips.

Figure 4A:
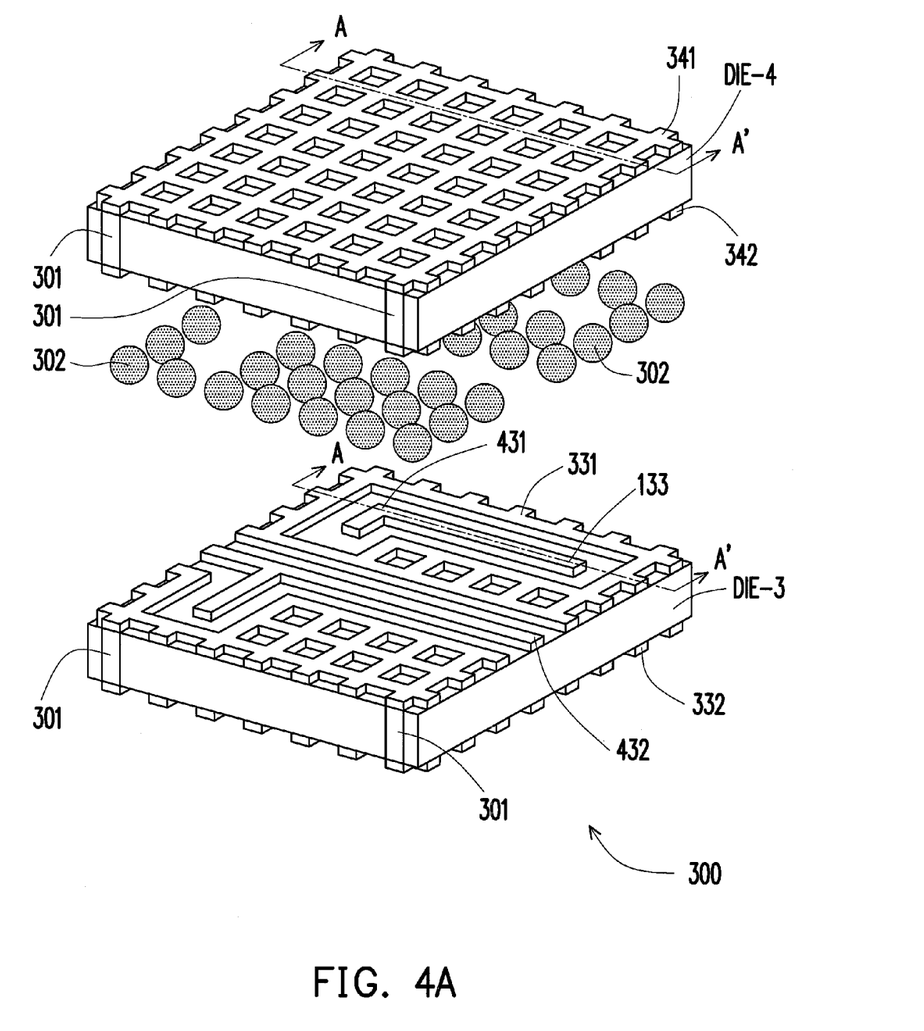
FIG. 4A is an exploded view illustrating a chip DIE-3 and a chip DIE-4 in FIG. 3 according to an exemplary embodiment of the present disclosure.
Figure 4B:
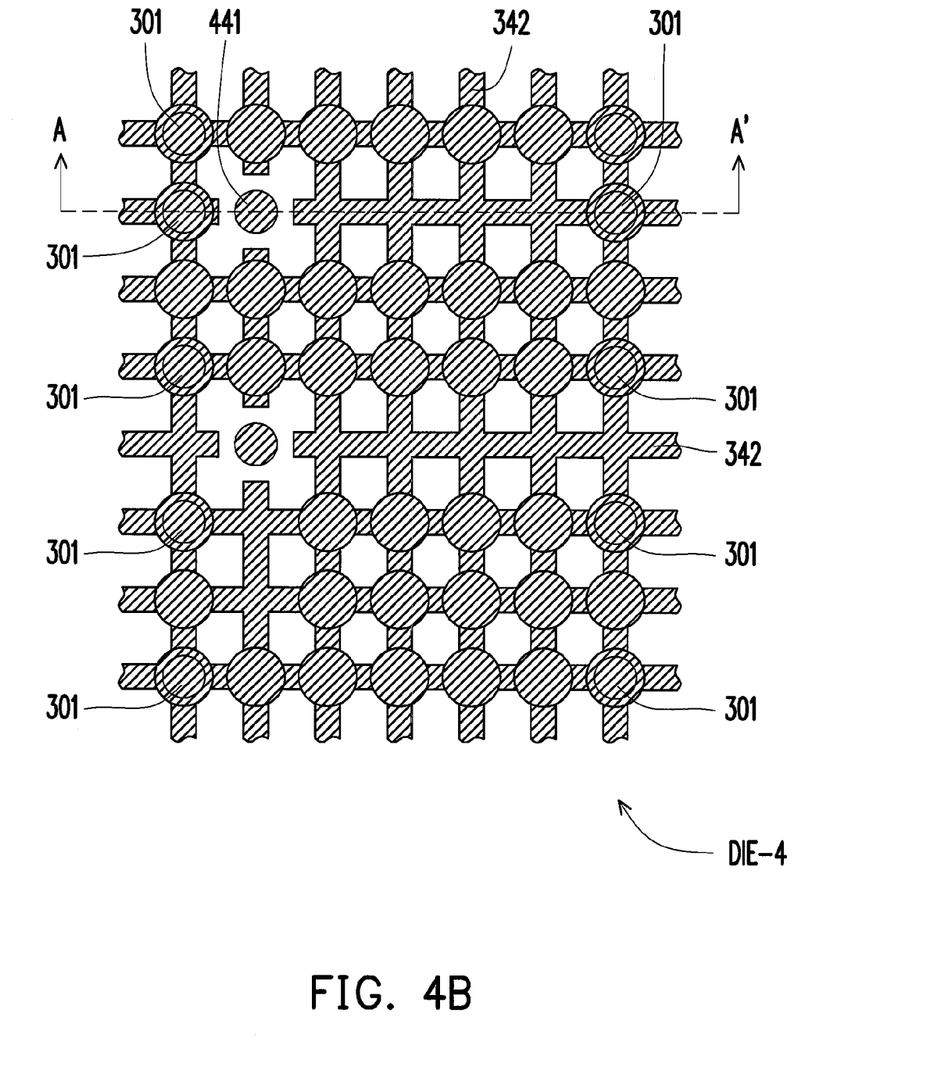
FIG. 4B is a schematic top layout diagram of a lower surface of the chip DIE-4 in FIG. 4A according to an exemplary embodiment of the present disclosure.
Figure 4C:
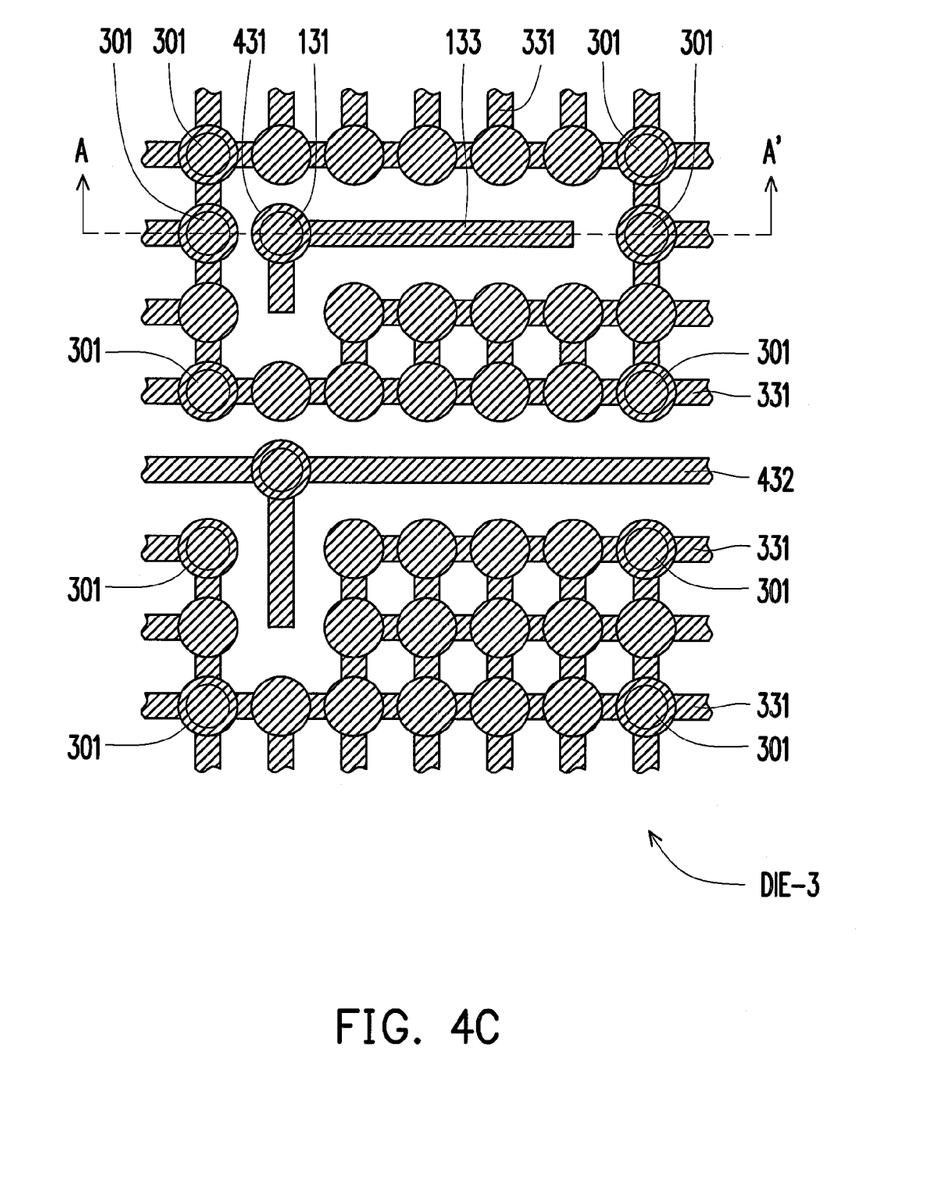
FIG. 4C is a schematic top layout diagram of an upper surface of the chip DIE-3 in FIG. 4A according to an exemplary embodiment of the present disclosure.

FIG. 4A is an exploded view illustrating the chip DIE-3 and the chip DIE-4 in FIG. 3 according to an exemplary embodiment of the present disclosure. FIG. 4B is a schematic top layout diagram of a lower surface of the chip DIE-4 in FIG. 4A according to an exemplary embodiment of the present disclosure. FIG. 4C is a schematic top layout diagram of an upper surface of the chip DIE-3 in FIG. 4A according to an exemplary embodiment of the present disclosure. A sectional view along a section line A-A' corresponding to FIG. 4A, FIG. 4B, and FIG. 4C is shown in FIG. 3. Referring to FIG. 3 and FIG. 4C, the upper surface of the chip DIE-3 is disposed with an interconnecting line 432 to transmit a power supply voltage VDD. In this exemplary embodiment, a first TSV structure 301 and a first conductive bump 302 can transmit a ground voltage GND. In addition, the upper surface of the chip DIE-3 is further disposed with an interconnecting line 133 to transmit a signal (a data signal or a control signal). The interconnecting line 133 is connected to a landing pad 431. A micro bump 132 is disposed on the landing pad 431, and is used to electrically connect to a landing pad 441 of the lower surface of the chip DIE-4 (as shown in FIG. 3 and FIG. 4B). The landing pad 441 is electrically insulated from a shielding layer 342.

Referring to FIG. 4C, a dummy area of the upper surface of the chip DIE-3 is disposed with a large mesh-shaped shielding layer 331. The shielding layer 331 is electrically connected to the ground voltage GND through the first TSV structure 301 and the first conductive bump 302. A dummy area of the lower surface of the chip DIE-4 is also disposed with a mesh-shaped shielding layer 342 correspondingly. The shielding layer 342 and the shielding layer 331 are connected to each other through the large quantity of first conductive bumps 302, as shown in FIG. 4A to FIG. 4C.

It should be noted that, dummy areas between the chips DIE-1 to DIE-4 may be disposed with the large quantity of the first TSV structures 301, and the first TSV structures 301 are helpful to heat transfer between the different shielding layers 311, 321, 322, 331, 332, 341, and 342. Therefore, the large quantity of first TSV structures 301 can uniform the change of the temperature of the circuits inside the multi-chip stack structure 300.

The above multi-chip stack structure 300 is an exemplary embodiment of the present disclosure. However, the present disclosure is not limited thereto. For example, the shielding layers 311, 321, 322, 331, 332, 341, and 342 shown in FIG. 3 and FIG. 4A to FIG. 4C can be used to transmit the power supply voltage VDD, and the interconnecting line 432 is responsible for transmitting the ground voltage GND.

Figure 5A:
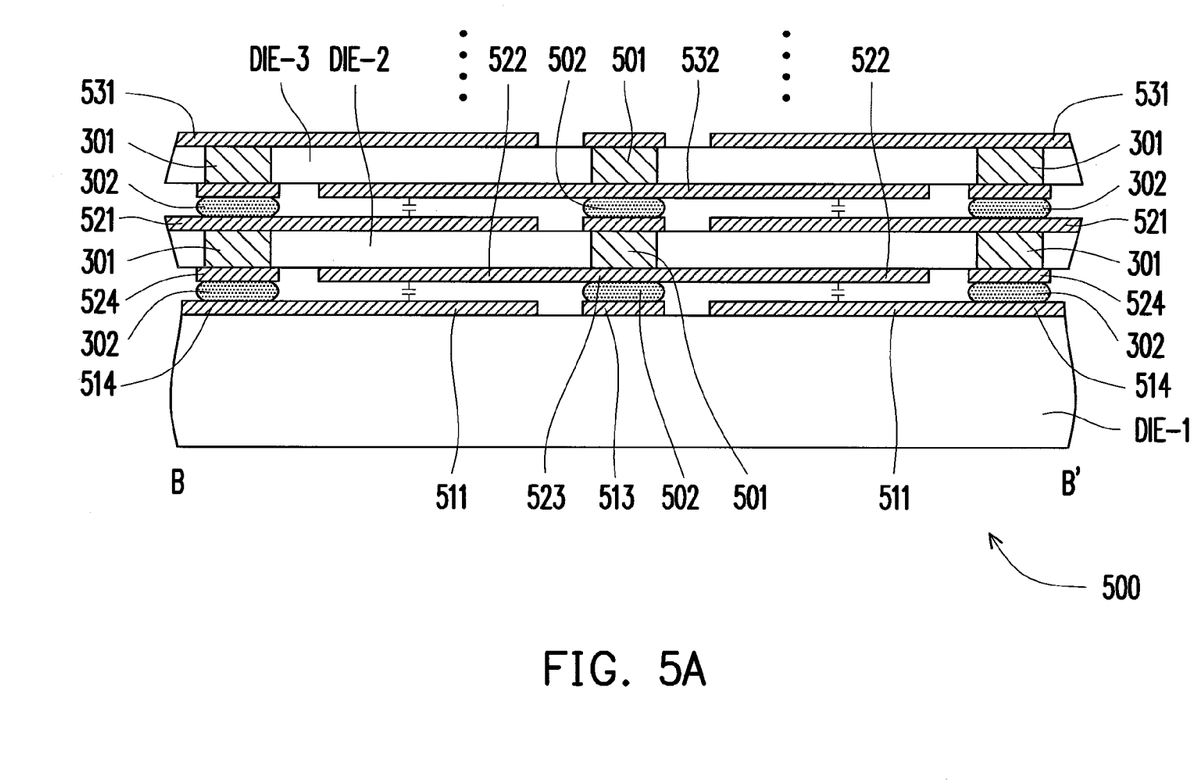
FIG. 5A is a schematic sectional view along a section line B-B' illustrating a multi-chip stack structure according to another exemplary embodiment of the present disclosure.

Alternatively, the shielding layers on the upper surfaces of the chips and the shielding layers on the lower surfaces of the chips are respectively electrically connected to reference voltages of different levels. FIG. 5A is a schematic sectional view along a section line B-B' illustrating a multi-chip stack structure 500 according to another exemplary embodiment of the present disclosure. Each of chips DIE-1 to DIE-3 has a plurality of first TSV structures 301 and a plurality of second TSV structures 501. The second TSV structures 501 of the different chips are connected to each other through second conductive bumps 502, and first TSV structures 301 of the different chips are connected to each other through first conductive bumps 302. In this exemplary embodiment, dummy TSV structures (for example, the dummy TSV structures 121 shown in FIG. 2) of the stacked chips may be used to realize the first TSV structures 301 and the second TSV structures 501; and dummy micro bumps (for example, the dummy micro bumps 122 shown in FIG. 2) between the stacked chips may be used to realize the first conductive bump 302 and the second conductive bump 502.

In the multi-chip stack structure 500, each dummy area of a lower surface and an upper surface of each of the chips is disposed with a shielding layer of a conductive material (such as metal). For example, the dummy area of the upper surface of the chip DIE-1 is disposed with a first shielding layer 511, the dummy area of the upper surface of the chip DIE-2 is disposed with a first shielding layer 521, the dummy area of the lower surface of the chip DIE-2 is disposed with a second shielding layer 522, the dummy area of the upper surface of the chip DIE-3 is disposed with a first shielding layer 531, and the dummy area of the lower surface of the chip DIE-3 is disposed with a second shielding layer 532.

Details of implementation of the multi-chip stack structure 500 are shown in relevant descriptions of the multi-chip stack structure 300 shown in FIG. 3 and FIG. 4A to FIG. 4C. Different from the multi-chip stack structure 300, in the multi-chip stack structure 500, the shielding layer on the upper surface of the chip and the shielding layer on the lower surface of the chip are respectively electrically connected to reference voltages of different levels. Thus, the shielding layer 511 on the upper surface of the chip DIE-1, the shielding layer 521 on the upper surface of the chip DIE-2, and the shielding layer 531 of the upper surface on the chip DIE-3 are electrically connected to the first conductive bumps 302 and the first TSV structures 301. The first shielding layers 511, 521, and 531 may be electrically connected to a first reference voltage through the first conductive bumps 302 and the first TSV structures 301. The shielding layer 522 on the lower surface of the chip DIE-2 and the shielding layer 532 on the lower surface of the chip DIE-3 are electrically connected to the second conductive bumps 502 and the second TSV structures 501. The second shielding layers 522 and 532 may be electrically connected to a second reference voltage through the second conductive bumps 502 and the second TSV structures 501.

The above first reference voltage and second reference voltage are fixed voltages of different levels, such as power supply voltages VDD, ground voltages GND, or other power supply voltages of fixed levels (other than signals). In some exemplary embodiments, the first reference voltage may be the power supply voltage VDD, and the second reference voltage may be the ground voltage GND. In some exemplary embodiments, the first reference voltage may be the ground voltage GND, and the second reference voltage may be the power supply voltage VDD.

Figure 5B:
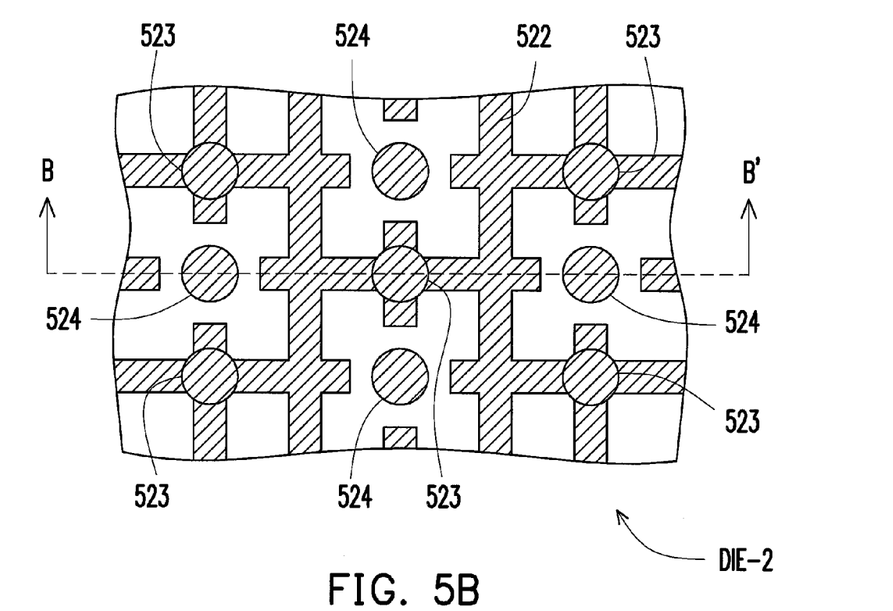
FIG. 5B is a schematic top layout diagram of a lower surface of a chip DIE-2 in FIG. 5A according to an exemplary embodiment of the present disclosure.
Figure 5C:
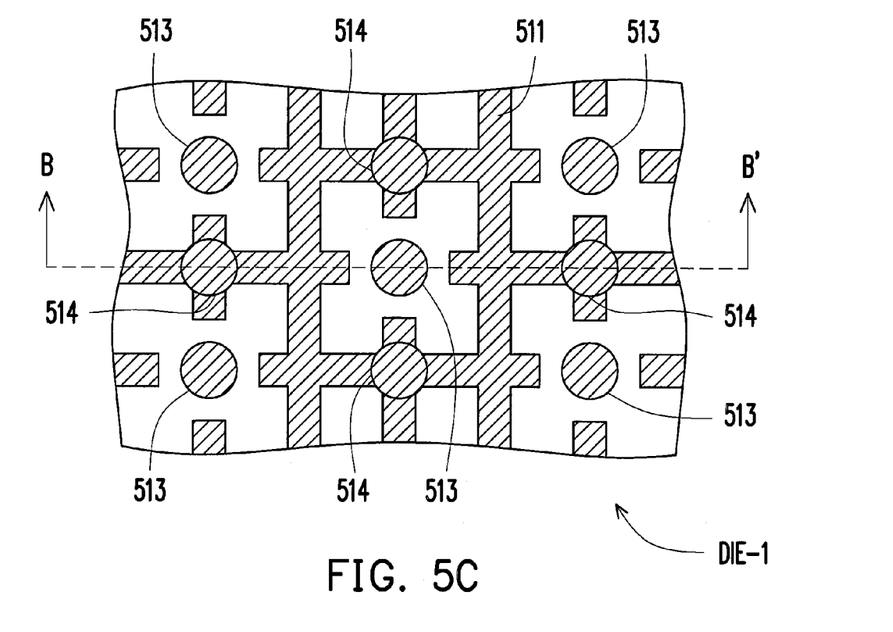
FIG. 5C is a schematic top layout diagram of an upper surface of a chip DIE-1 in FIG. 5A according to an exemplary embodiment of the present disclosure.

FIG. 5B is a schematic top layout diagram of the lower surface of the second chip DIE-2 in FIG. 5A according to an exemplary embodiment of the present disclosure. FIG. 5C is a schematic top layout diagram of the upper surface of the first chip DIE-1 in FIG. 5A according to an exemplary embodiment of the present disclosure. The sectional view along the section line B-B' corresponding to FIG. 5B and FIG. 5C is shown in FIG. 5A. Referring to FIG. 5A and FIG. 5B, the dummy area of the lower surface of the second chip DIE-2 is disposed with a large mesh-shaped second shielding layer 522. The second shielding layer 522 is connected to a landing pad 523. A second conductive bump 502 is disposed under the landing pad 523, and is used to electrically connect to a landing pad 513 on the upper surface of the first chip DIE-1 (as shown in FIG. 5A and FIG. 5C). The landing pad 513 is electrically insulated from the shielding layer 511. The second TSV structures 501 and the second conductive bumps 502 can transmit the second reference voltage to the second shielding layers 522 and 532.

Referring to FIG. 5A and FIG. 5C, the dummy area of the upper surface of the first chip DIE-1 is disposed with the large mesh-shaped first shielding layer 511. The first shielding layer 511 is connected to a landing pad 514. The first conductive bump 302 is disposed on the landing pad 514, and is used to electrically connect to a landing pad 524 on the lower surface of the second chip DIE-2 and the first TSV structure 301 of the second chip DIE-2 (as shown in FIG. 5A and FIG. 5B). The landing pad 524 is electrically insulated from the shielding layer 522. The first TSV structures 301 and the first conductive bumps 302 can transmit the first reference voltage to the first shielding layers 511, 521, and 531.

Referring to FIG. 5A, in the multi-chip stack structure 500, equivalent capacitance is formed between the chips; that is to say, regulator capacitance is formed between the power supply voltage VDD and the ground voltage GND. Therefore, the multi-chip stack structure 500 has a steady Direct Current (DC) voltage level, and space for laying out regulator capacitors in the chips are saved, thus improving stability of the circuits and reducing cost. In addition, characteristics of the capacitance may also be improved by filling various under-fill materials (dielectrics of capacitors) into the multi-chip stack structure 500.

Figure 5D:
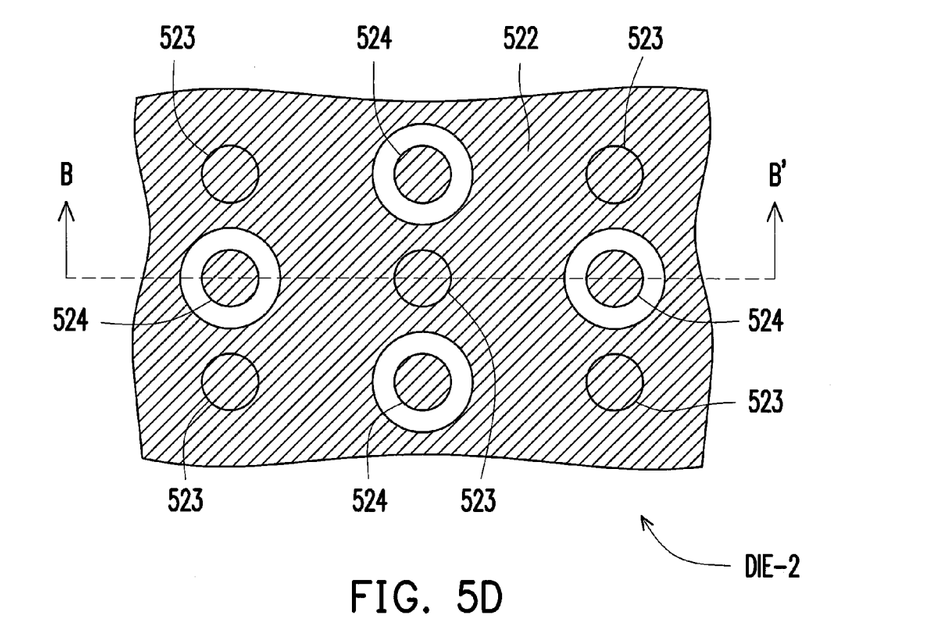
FIG. 5D is a schematic top layout diagram of a lower surface of the chip DIE-2 in FIG. 5A according to another exemplary embodiment of the present disclosure.
Figure 5E:
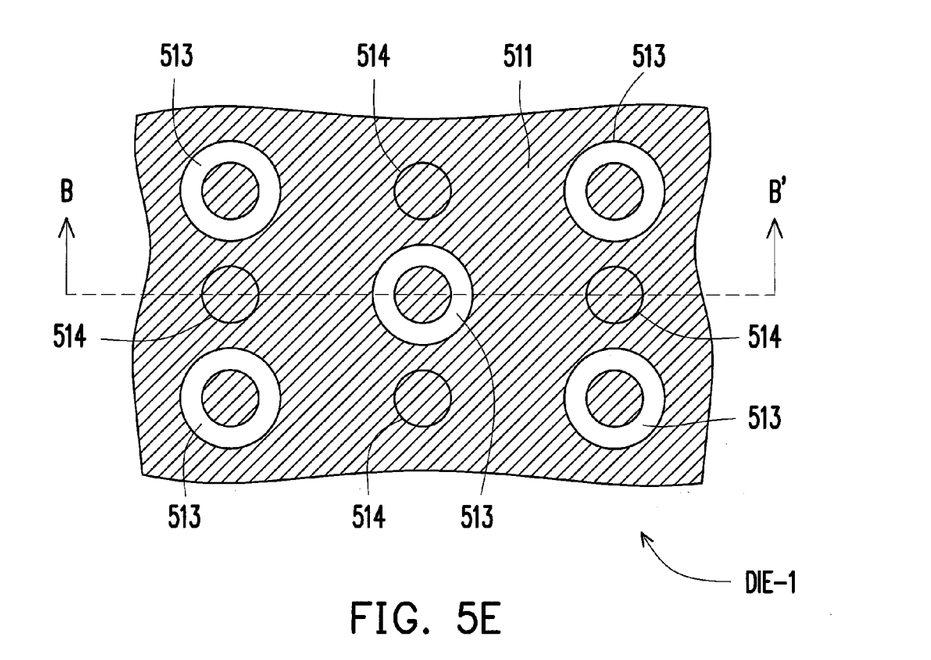
FIG. 5E is a schematic top layout diagram of an upper surface of the chip DIE-1 in FIG. 5A according to another exemplary embodiment of the present disclosure.

All of the shielding layers in the above exemplary embodiments are mesh-shaped, but the present disclosure does not limit the shape of the shielding layer. Besides being mesh-shaped, the shielding layer may also be finger-shaped, palisade-shaped, or planar. For example, FIG. 5D is a schematic top layout diagram of the lower surface of the second chip DIE-2 in FIG. 5A according to another exemplary embodiment of the present disclosure. FIG. 5E is a schematic top layout diagram of the upper surface of the first chip DIE-1 in FIG. 5A according to another exemplary embodiment of the present disclosure. In the exemplary embodiments shown in FIG. 5D and FIG. 5E, a first shielding layer 511 and a second shielding layer 522 are realized by using planar metal layers.

Figure 6A:
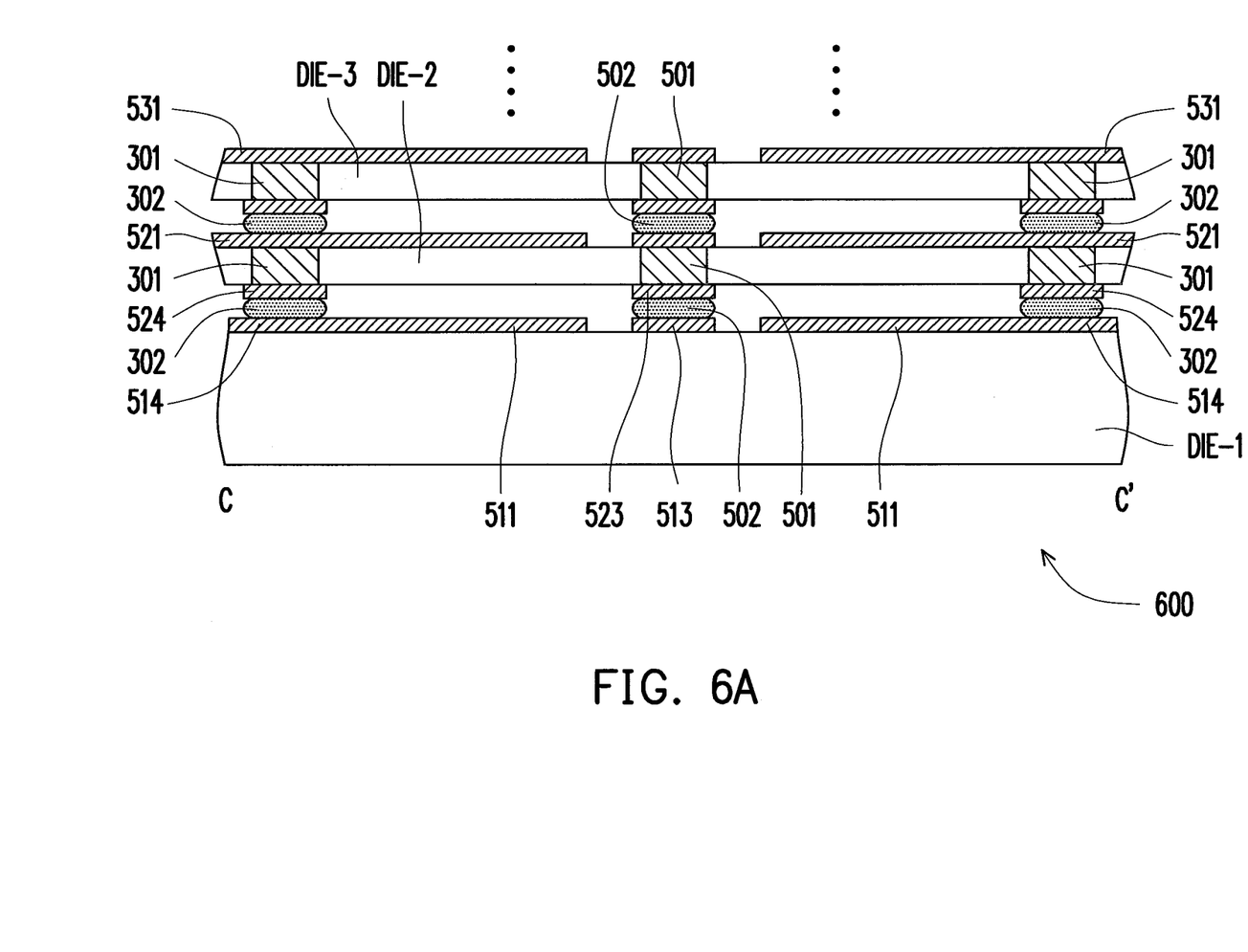
FIG. 6A is a schematic sectional view along a section line C-C' illustrating a multi-chip stack structure according to another exemplary embodiment of the present disclosure.

In both the above multi-chip stack structures 300 and 500, the upper surface of a chip is disposed with a first shielding layer and the lower surface of the same chip is disposed with a second shielding layer, but the present disclosure is not limited thereto. For example, FIG. 6A is a schematic sectional view along a section line C-C' illustrating a multi-chip stack structure 600 according to another exemplary embodiment of the present disclosure. Details of implementation of the multi-chip stack structure 600 are shown in relevant descriptions of the multi-chip stack structure 500 shown in FIG. 5A to FIG. 5E. Different from the multi-chip stack structure 500, in the multi-chip stack structure 600, the lower surface of the chip is not disposed with the second shielding layer.

The second chip DIE-2 is stacked on the first chip DIE-1, and the third chip DIE-3 is stacked on the second chip DIE-2. Each of the chips DIE-1 to DIE-3 has a plurality of first TSV structures 301 and a plurality of second TSV structures 501. The second TSV structures 501 of the different chips are connected to each other through second conductive bumps 502, and first TSV structures 301 of the different chips are connected to each other through first conductive bumps 302.

Thus, the first shielding layer 511 of the upper surface of the first chip DIE-1, the first shielding layer 521 of the upper surface of the second chip DIE-2, and the first shielding layer 531 of the upper surface of the third chip DIE-3 are electrically connected to the first conductive bumps 302 and the first TSV structures 301. The first shielding layers 511, 521, and 531 may be electrically connected to a first reference voltage through the first conductive bumps 302 and the first TSV structures 301. The first reference voltage may be a power supply voltage VDD, a ground voltage GND, or other power supply voltages of fixed levels (other than signals).

In the multi-chip stack structure 600, a dummy area of the upper surface of each of the chips is disposed with a first shielding layer of a conductive material (such as metal). For example, the dummy area of the upper surface of the first chip DIE-1 is disposed with the first shielding layer 511, the dummy area of the upper surface of the second chip DIE-2 is disposed with the first shielding layer 521, and the dummy area of the upper surface of the third chip DIE-3 is disposed with the first shielding layer 531.

Figure 6B:
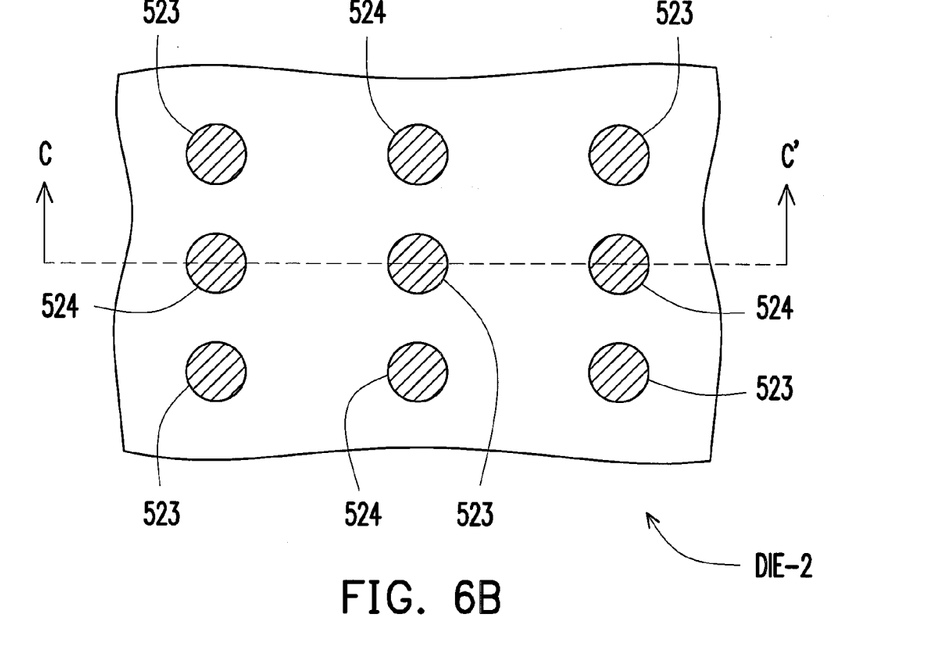
FIG. 6B is a schematic top layout diagram of a lower surface of a chip DIE-2 in FIG. 6A according to an exemplary embodiment of the present disclosure.
Figure 6C:
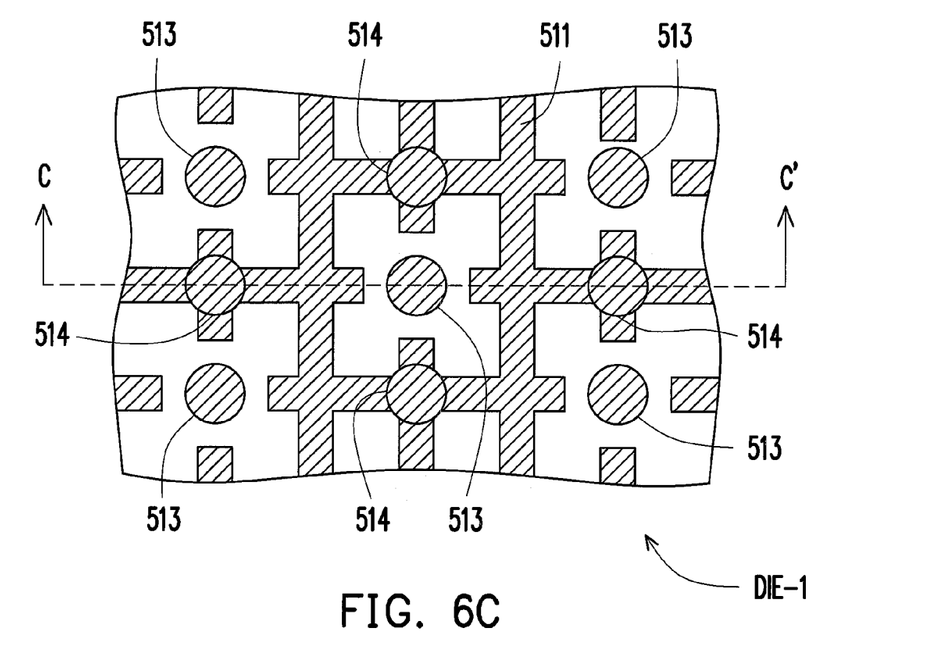
FIG. 6C is a schematic top layout diagram of an upper surface of a chip DIE-1 in FIG. 6A according to an exemplary embodiment of the present disclosure.

FIG. 6B is a schematic top layout diagram of the lower surface of the second chip DIE-2 in FIG. 6A according to an exemplary embodiment of the present disclosure. FIG. 6C is a schematic top layout diagram of the upper surface of the first chip DIE-1 in FIG. 6A according to an exemplary embodiment of the present disclosure. The sectional view along the section line C-C' corresponding to FIG. 6B and FIG. 6C is shown in FIG. 6A. Referring to FIG. 6B, the dummy area of the lower surface of the second chip DIE-2 is not disposed with a shielding layer. Referring to FIG. 6A and FIG. 6C, the dummy area of the upper surface of the first chip DIE-1 is disposed with the large mesh-shaped first shielding layer 511. The first shielding layer 511 is connected to a landing pad 514. The first conductive bump 302 is disposed on the landing pad 514, and is used to electrically connect to a landing pad 524 on the lower surface of the second chip DIE-2 and the first TSV structure 301 of the second chip DIE-2 (as shown in FIG. 6A and FIG. 6B). The first TSV structures 301 and the first conductive bumps 302 can transmit a first reference voltage to the first shielding layers 511, 521, and 531.

Figure 7A:
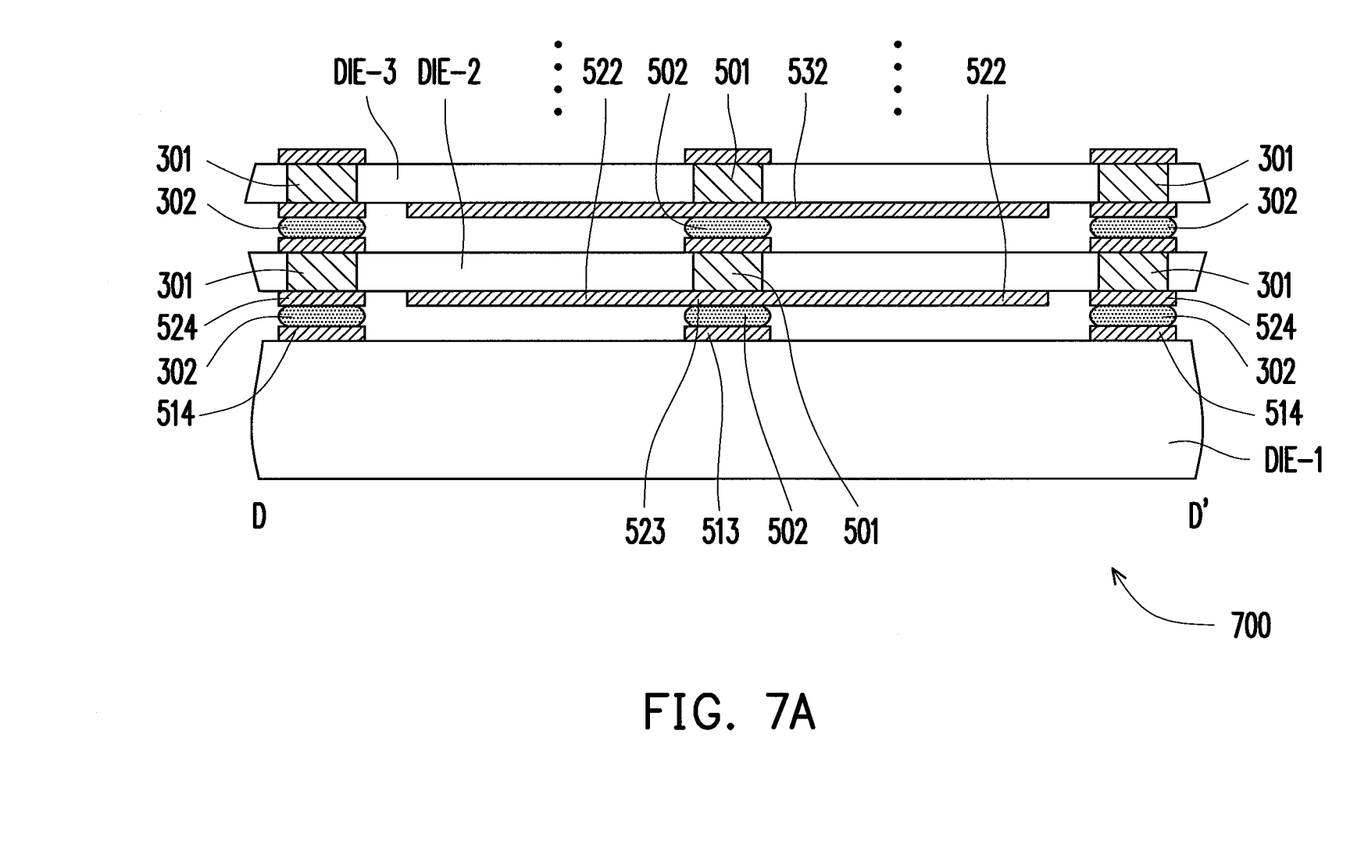
FIG. 7A is a schematic sectional view along a section line D-D' illustrating a multi-chip stack structure according to another exemplary embodiment of the present disclosure.

FIG. 7A is a schematic sectional view along a section line D-D' illustrating a multi-chip stack structure 700 according to another exemplary embodiment of the present disclosure. Details of implementation of the multi-chip stack structure 700 are shown in relevant descriptions of the multi-chip stack structure 500 shown in FIG. 5A to FIG. 5E. Different from the multi-chip stack structure 500, in the multi-chip stack structure 700, the upper surface of the chip is not disposed with the first shielding layer.

In the multi-chip stack structure 700 herein, a dummy area of the lower surface of each of the chips is disposed with a second shielding layer of a conductive material (such as metal). For example, the dummy area of the lower surface of the second chip DIE-2 is disposed with the second shielding layer 522, and the dummy area of the lower surface of the third chip DIE-3 is disposed with the second shielding layer 532. The second shielding layer 522 and the second shielding layer 532 are electrically connected to the second conductive bump 502 and the second TSV structures 501. The second shielding layers 522 and 532 may be electrically connected to a second reference voltage through the second conductive bumps 502 and the second TSV structures 501. The second reference voltage may be a power supply voltage VDD, a ground voltage GND, or other power supply voltages of fixed levels (other than signals).

Figure 7B:
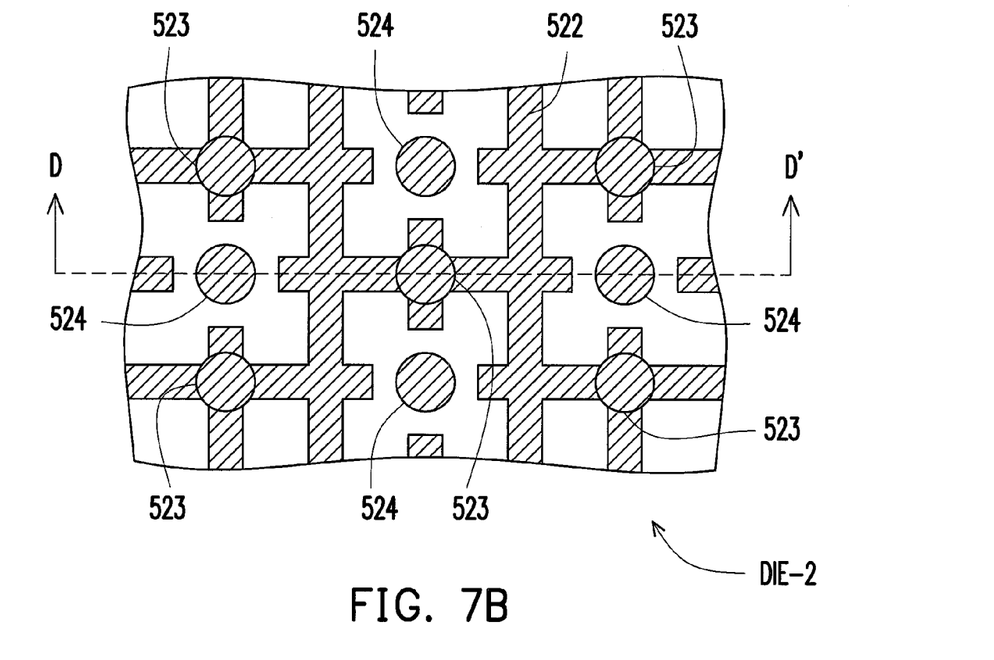
FIG. 7B is a schematic top layout diagram of a lower surface of a chip DIE-2 in FIG. 7A according to an exemplary embodiment of the present disclosure.
Figure 7C:
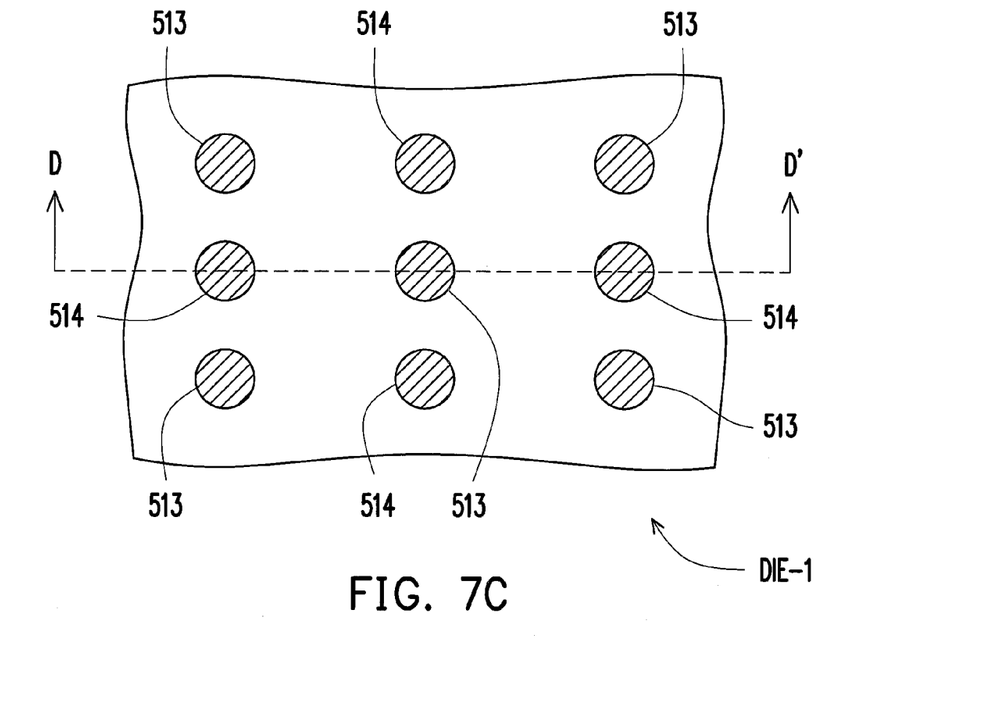
FIG. 7C is a schematic top layout diagram of an upper surface of a chip DIE-1 in FIG. 7A according to an exemplary embodiment of the present disclosure.

FIG. 7B is a schematic top layout diagram of the lower surface of the second chip DIE-2 in FIG. 7A according to an exemplary embodiment of the present disclosure. FIG. 7C is a schematic top layout diagram of the upper surface of the first chip DIE-1 in FIG. 7A according to an exemplary embodiment of the present disclosure. The sectional view along the section line D-D' corresponding to FIG. 7B and FIG. 7C is shown in FIG. 7A. Referring to FIG. 7C, the dummy area of the upper surface of the first chip DIE-1 is not disposed with a shielding layer. Referring to FIG. 7A and FIG. 7B, the dummy area of the lower surface of the second chip DIE-2 is disposed with a large mesh-shaped second shielding layer 522. The second shielding layer 522 is connected to a landing pad 523. The second conductive bump 502 is disposed under the landing pad 523 electrically connected to the second TSV structures 501, and is used to electrically connect to the landing pad 513 of the upper surface of the first chip DIE-1 (as shown in FIG. 7A and FIG. 7C). The second TSV structures 501 and the second conductive bumps 502 can transmit the second reference voltage to the second shielding layers 522 and 532.

In view of the above, in the exemplary embodiments of the present disclosure, the dummy areas (areas not used to dispose transmission lines yet) of the upper surfaces and/or the lower surfaces of the chips are used to dispose the shielding layers having the reference voltages. The shielding layers can form effective barriers, so as to solve the problem of noise interference and signal coupling. In addition, the shielding layers may also be used as the heat sink layers between the chips to conduct the heat inside the stack structure, thus uniforming the change of the temperature of the circuits inside the stack structure, decreasing the operating temperature inside the chip, and ensuring steady operation of the circuits. Additionally, the plurality of conductive bumps and the plurality of TSV structures together transmit the same reference voltage, thus decreasing the equivalent resistance of the transmission paths, and reducing the error of the reference voltage level between the different chips.

The disclosure being thus described, it will be obvious that the same may be varied in many ways. Such variations are not to be regarded as a departure from the spirit and scope of the disclosure, and all such modifications as would be obvious to one skilled in the art are intended to be included within the scope of the following claims.

What is claimed is:

1. A multi-chip stack structure, comprising:
    a first chip;
    a second chip, stacked on the first chip, and comprising a plurality of first through silicon via (TSV) structures to conduct a first reference voltage, wherein dummy TSV structures of the second chip are used to realize the first TSV structures for transferring heat between the first chip and the second chip;
    a plurality of first conductive bumps, disposed between the plurality of first chip and the second chip, and electrically connected to the plurality of first TSV structures, wherein dummy micro bumps of the multi-chip stack structure are used to realize the first conductive bumps; and
    a first shielding layer, disposed between the first chip and the plurality of first conductive bumps, and electrically connected to the plurality of first conductive bumps, wherein the first shielding layer is disposed in dummy area of the first chip for conducting heat between the first chip and the second chip.

2. The multi-chip stack structure according to claim 1, wherein the second chip further comprises a plurality of second TSV structures to conduct a second reference voltage, and the multi-chip stack structure further comprises:
    a plurality of second conductive bumps, disposed between the first chip and the second chip, and electrically connected to the plurality of second TSV structures; and
    a second shielding layer, disposed between the second chip and the plurality of second conductive bumps, and electrically connected to the plurality of second TSV structures.

3. The multi-chip stack structure according to claim 2, wherein the second shielding layer is mesh-shaped or planar.

4. The multi-chip stack structure according to claim 2, wherein one of the first reference voltage and the second reference voltage is a ground voltage, and the other one of the first reference voltage and the second reference voltage is a power supply voltage.

5. The multi-chip stack structure according to claim 2, wherein the first reference voltage or the second reference voltage is a ground voltage or a power supply voltage.

6. The multi-chip stack structure according to claim 1, wherein the first shielding layer is mesh-shaped or planar.

7. The multi-chip stack structure according to claim 1, further comprising:
    a second shielding layer, disposed between the second chip and the plurality of first conductive bumps, and electrically connected to the plurality of first TSV structures.

* * * * *